United States Patent

Huang et al.

[11] Patent Number: 5,846,866
[45] Date of Patent: Dec. 8, 1998

[54] DRAIN EXTENSION REGIONS IN LOW VOLTAGE LATERAL DMOS DEVICES

[75] Inventors: Robert Y. S. Huang, Ocoee, Fla.; Monir El-Diwany, Saratoga, Calif.

[73] Assignee: National Semiconductor Corporation, Santa Clara, Calif.

[21] Appl. No.: 897,278

[22] Filed: Jul. 21, 1997

Related U.S. Application Data

[62] Division of Ser. No. 795,155, Feb. 7, 1997, abandoned.

[51] Int. Cl.$^6$ ............................................. H01L 21/8224
[52] U.S. Cl. ........................................... 438/306; 438/336
[58] Field of Search ................................. 438/306, 163; 257/336, 344, 408

[56] References Cited

U.S. PATENT DOCUMENTS 5,517,046   5/1996   Hsing et al. ........................... 257/336
5,635,743   6/1997   Takahashi ............................. 257/343

Primary Examiner—Charles Bowers
Assistant Examiner—Craig Thompson
Attorney, Agent, or Firm—Limbach & Limbach LLP

[57] ABSTRACT

Disclosed are MOSFET devices in which a region extends from the drain and is, self-aligned with the gate. The region has a lower dopant concentration than the drain. The presence of the extension region substantially enhances breakdown voltage while not adding excessive on-resistance for the devices.

4 Claims, 10 Drawing Sheets

DRAIN EXTENSION REGIONS IN LOW VOLTAGE LATERAL DMOS DEVICES

This is a divisional of application Ser. No. 08/795,155, filed Feb. 7, 1997 now abandoned.

BACKGROUND OF THE INVENTION

1. Field of the Invention

The present invention relates to low voltage lateral DMOS devices having improved breakdown voltage and on-resistance characteristics. In particular, the present invention relates to low voltage lateral DMOS devices having a drain extension region.

2. Description of the Related Art

For the power integrated circuit class of chips, there are various transistor configurations available, such as vertical DMOS, low voltage lateral DMOS and high voltage lateral DMOS devices, each of which has different specifications. In order to minimize power dissipation from these devices, it is desirable that the transistor operate at a relatively low on-resistance, $R_{DS}$. Likewise, it is desirable to have a relatively high breakdown voltage, BV, in order to protect the device and the circuit. However, high breakdown voltage requirements are contrary to those for achieving low $R_{DS}$.

In conventional lateral DMOS (LDMOS) devices 10 such as that shown in FIG. 1, the highest electrical field that initiates avalanche breakdown generally occurs at the interface between the gate 12 and drain 14. It is desirable to lower the maximum electrical field at this location and at the same time spread the electrical field profile more uniformly in order to sustain the breakdown voltage. Morikawa, et al. describe, in the Proceedings of the Fourth International Symposium on Power Semiconductor Devices & ICs, May 19–21, 1992, Waseda University, Tokyo, Japan (pp. 150–154), a 30 volt breakdown voltage and a 0.075 $\Omega$mm$^2$ on-resistance LDMOS device 20 shown in FIG. 2. The device 20 includes a deep N well 22 below the drain 24 and an aluminum field plate 26 to produce a bias which is said to increase the breakdown voltage.

UK Patent Application No. GB 2277406A by K. Fujita, and Mitsubishi Denki Kabushiki Kaisha, discloses a double diffused type MOSFET 30 having a lightly doped drain 32 adjacent to drain region 14 (FIG. 3). Both the impurity diffusion layer 34 and the substrate 36 are p-type, though the former has a relatively higher impurity concentration than the latter in order to establish higher threshold voltage.

U.S. Pat. No. 4,300,150 discloses an LDMOS device 40 shown in FIG. 4 that includes a p/n-type "field shaping" semiconductor layer 42 buried in a p/n-type substrate 44. The layer 42 has a higher dopant concentration than the substrate 44. Layer 42 is spaced from the channel region 46 in order to reduce the electric field density adjacent to the p/n junction 48 between the substrate 44 and the channel 46, on the one hand, and the source 50 and drain 52 on the other, but increases the electric field density adjacent to the drain 52 in order to achieve a more homogeneous electric field distribution in the device 40. The field shaping semiconductor layer 42 is buried in the substrate 44 and extends beneath the channel 46 and part of the substrate 44 between the source 50 and drain 52. In one embodiment, field shaping semiconductor layer takes the form of a surface layer 43 in a surface-adjacent region of the epitaxial layer 45 along side drain 52 and extending from drain toward, but not contacting channel 46.

As illustrated in FIG. 5, U.S. Pat. Nos. 4,232,327 and 4,318,216, by Hsu and assigned to RCA Corporation, disclose a MOSFET device 60 in which a source 62, drain 64 and so-called "drift region" 66 are all formed in a channel region 68 of a semiconductor body 70. The drift region 66 is formed by implantation and is aligned with a gate 72 and then the source and drain regions 62, 64 are formed.

The present invention provides a method for forming an extended drain field effect transistor that includes the steps of forming a gate over an insulating layer on a surface of a semiconductor surface; forming a channel region in the substrate, where the channel region partially underlies the gate and has a conductivity type opposite to the conductivity type of the substrate; forming a first doped region in the channel and a second doped region in the substrate where the first and second doped regions have the first conductivity type and the second doped region has a dopant concentration that is higher than that of the substrate and wherein the first and second doped regions are spaced apart from each other and each is aligned with an edge of the gate; and implanting to convert the first doped region into a source in the channel and to form a drain in the substrate extending to the second doped region, where the source has a doped concentration of the first conductivity type that is higher than that in the first doped region and the second doped region has a dopant concentration that is between that of the source (or drain) and that of the layer.

By adjusting the length of the extension region, its doping profile and the implant species, one may optimize the breakdown voltage at a given on-resistance with the device.

DESCRIPTION OF THE INVENTION

Generally, the present invention relates to MOS transistors having an extension region on the drain. The extension region has selected length, doping profile and implant species for optimal breakdown voltage characteristics without excessively high on-resistance.

Suitable breakdown voltage and on-resistance characteristics have been achieved in LDMOS devices according to the present invention by proper selection of extension region length, doping concentration and dopant type.

Figure 1:
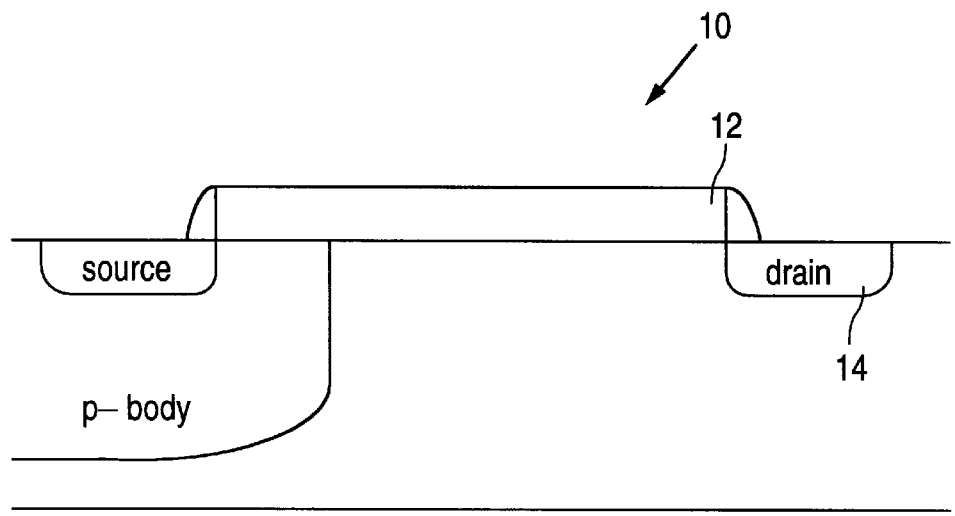
FIGS. 1, 2, 3, 4 and 5 are cross-sectional views illustrating prior art LDMOS devices.
Figure 2:
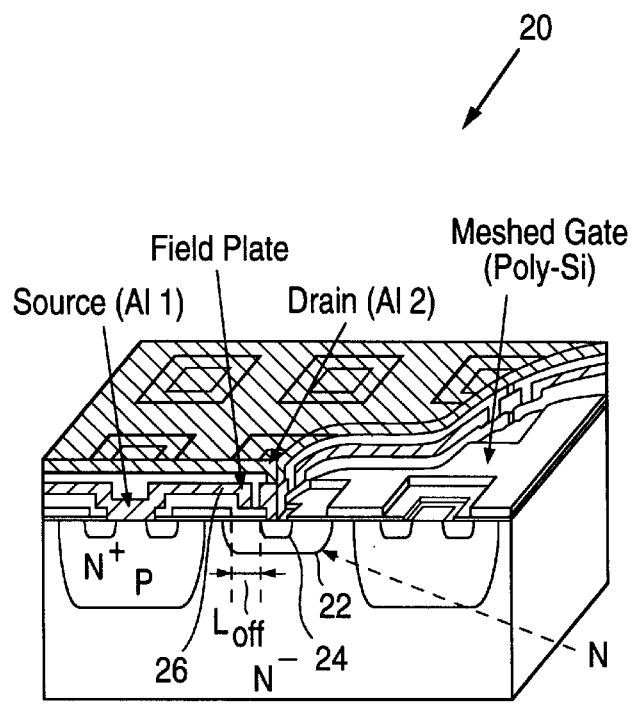
Figure 3:
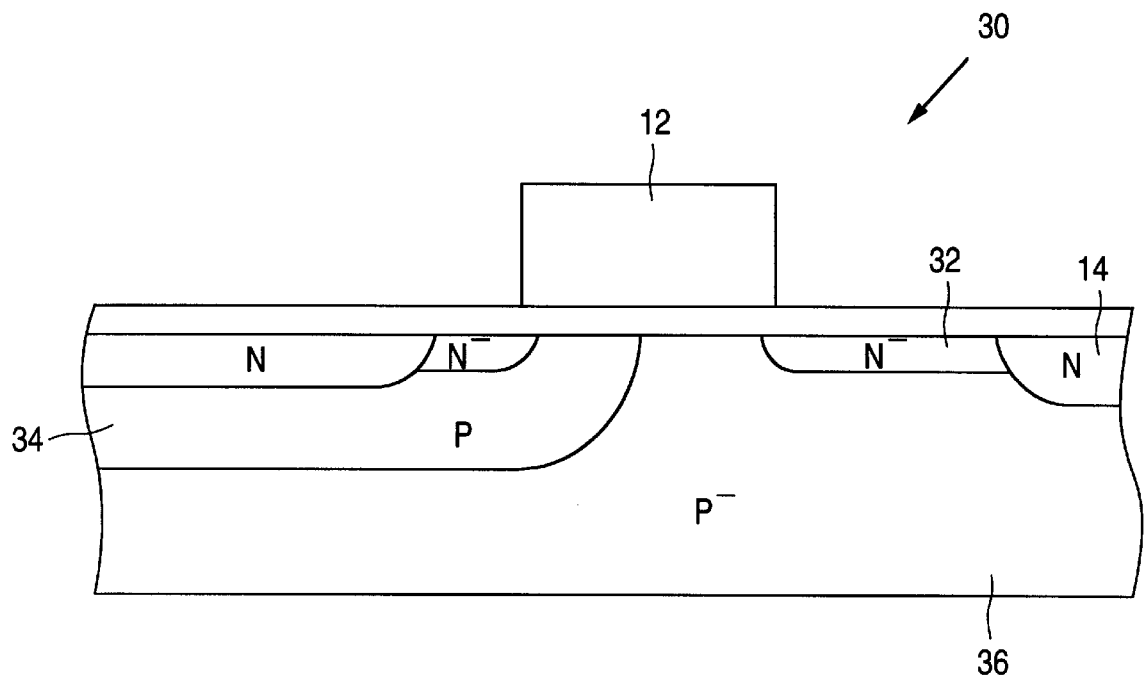
Figure 4:
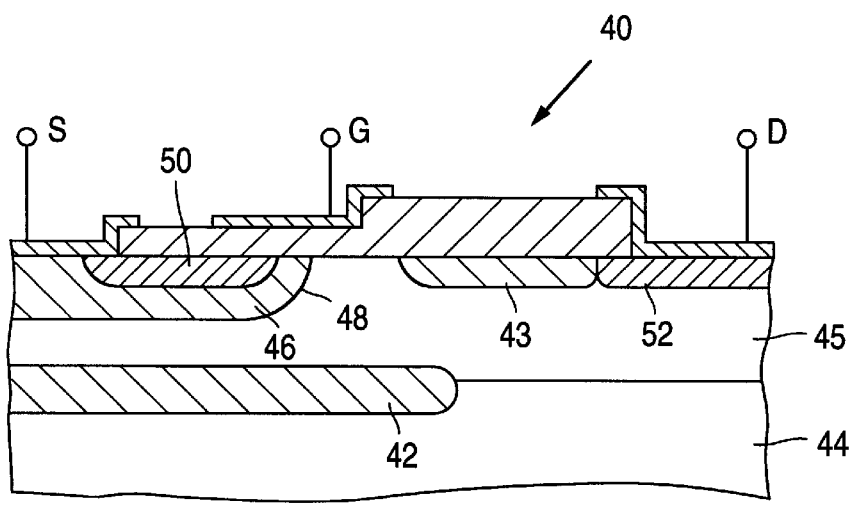
Figure 5:
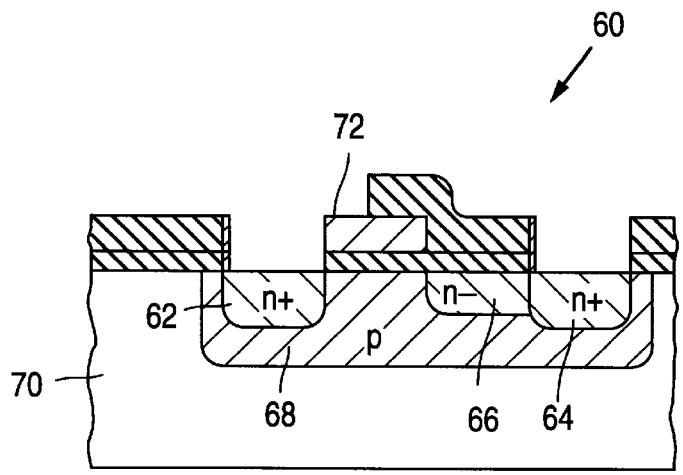
Figure 6:
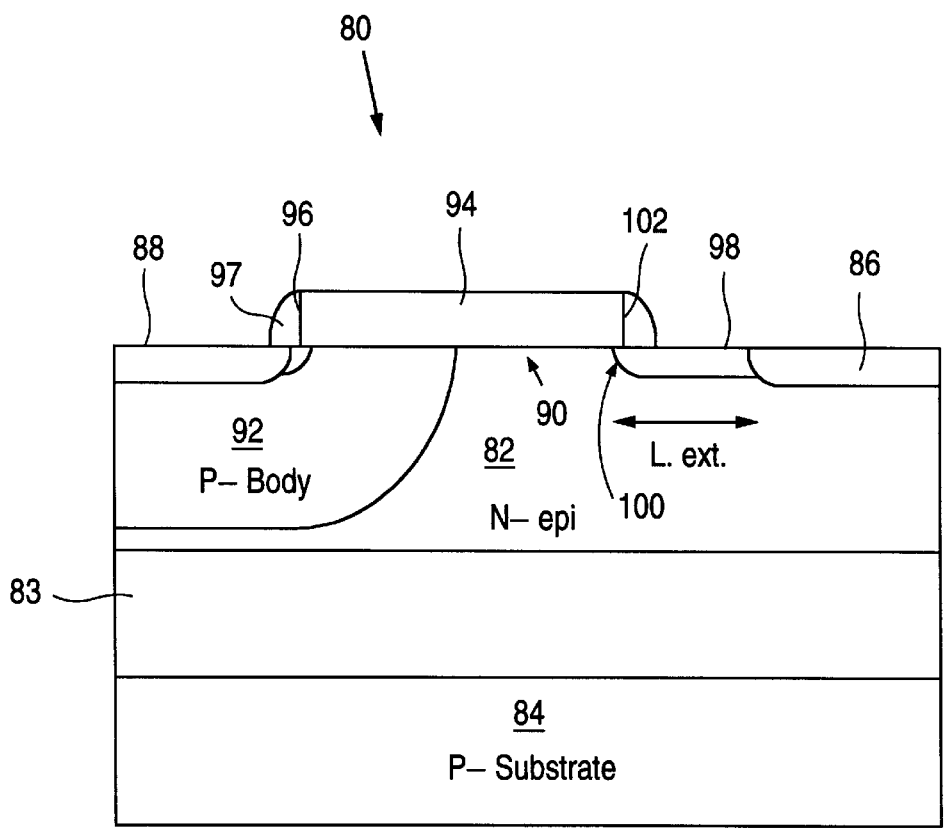
FIG. 6 is a cross-sectional view illustrating a device according to the present invention.

An exemplary LDMOS device according to the present invention is illustrated in FIG. 6. In FIG. 6, a MOSFET device 80 includes an epitaxial layer 82 formed on an N+ buried layer 83 and p-type semiconductor substrate 84. The $N^+$ layer 83 may be useful in improving device ruggedness.

A drain 86 and a source 88 are formed in an upper surface 90 of layer 82. Source 88 has the same conductivity type, which can comprise one or more dopant species, as layer 82, but is formed within a channel (also referred to herein as "p-body") 92 in layer 82. Channel 92 has the opposite conductivity type as source 88 and substrate 84. Drain 86 is formed in and has the same conductivity type as, but higher dopant concentration than, layer 82. Source 88 has the opposite conductivity type as substrate 84.

A gate electrode 94 overlies upper surface 90 of layer 82, gate oxide 95 and channel 92. Source 88 is self-aligned with edge 96 of gate electrode 94, but is offset by the width of spacer 97.

Also formed in layer 82 is a region 98 near drain 86. Region 98 has an edge 100 that is self-aligned with edge 102 of gate electrode 94. Region 98 (also referred to herein as an "extension region") also has the same conductivity type as source 88 and drain 86. Preferably, the dopant concentration in region 98 is between that in the source (or drain) and layer 82. In some embodiments of the present invention, region 98 may extend the full length of the drain 86, i.e., have the same dopant concentration as layer 82. In forming devices according to the present invention, the doping profile adjacent to the gate (i.e., between the source 88, extension region 98, drain 86 and layer 82) should change gradually so that the peak of the electric field adjacent to the gate is reduced. As a result, desirably high breakdown voltage for the device is achieved without excessively high on-resistance.

Suitable lengths of the extension region are generally those for which adequately high breakdown voltages are achieved without excessive on-resistance for the device.

A typical device according to the present invention would include the following dopant concentrations: lightly doped $N^-$ (e.g., $10^{15}$–$10^{16}$/cm$^3$) in the epitaxial layer 82, heavily doped $N^+$ in the drain and source regions 86/88 with peak doping of about $10^{20}$/cm$^3$, and sufficient $N^+$ doping in the extension region 98 to achieve suitable balance between high breakdown voltage characteristics and low $R_{DS}$.

Generally, the following additional observations may be made with regard to the extension region. The product of the length of the extension region and the resistivity therein is proportional to the additional series resistance incurred by the presence of an extension region according to the present invention. For the same resistance, too high a resistivity and too short a length lead to high variability in the series resistance of the device since variations in the length due to misalignment become significant, even when using advanced lithographic tools. On the other hand, lower resistivity combined with sufficiently long extension leads to reduced breakdown voltage.

Figure 7:
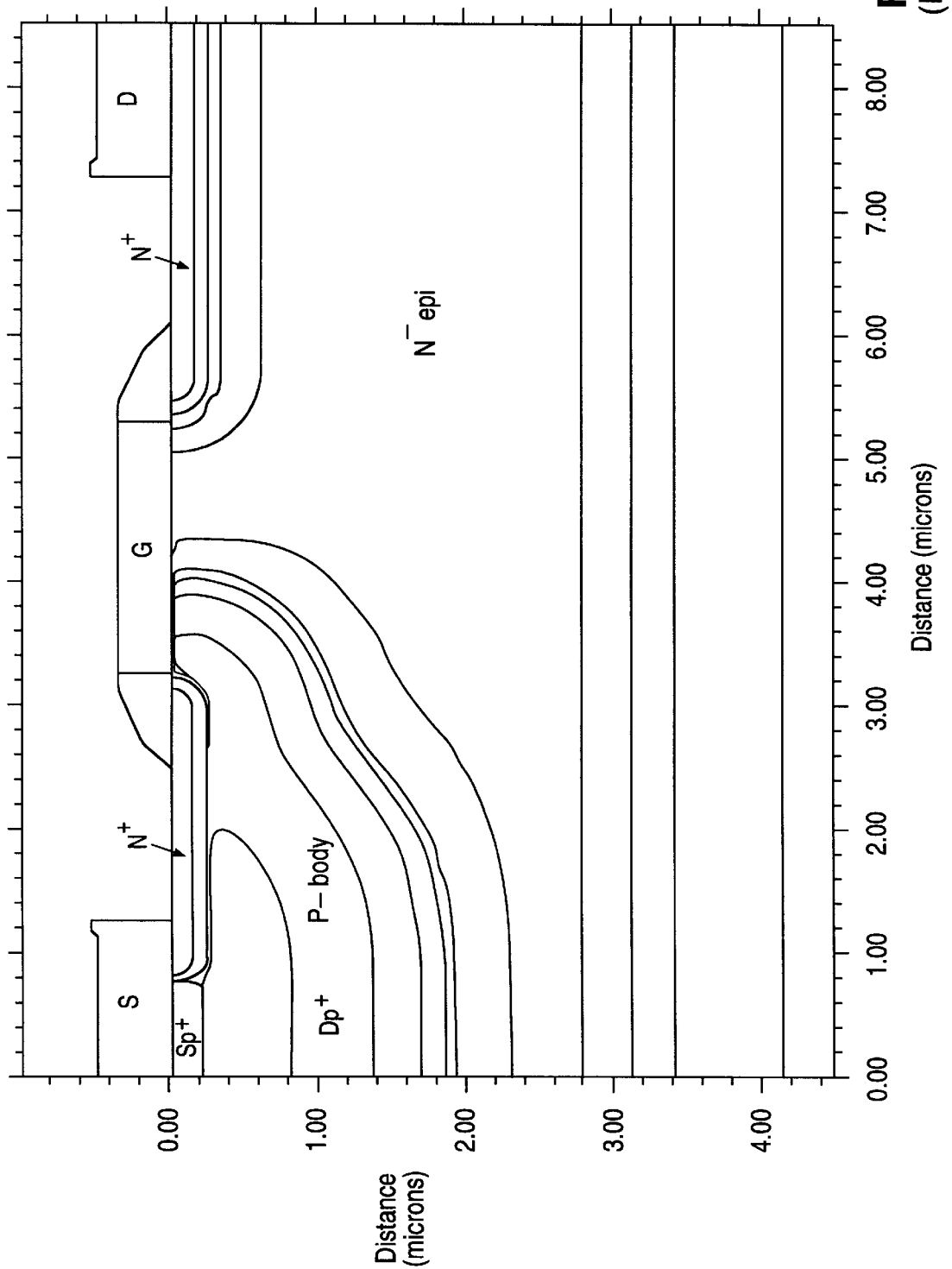
FIG. 7 is a graph showing the two dimensional dopant distribution in a conventional LDMOS device.
Figure 8:
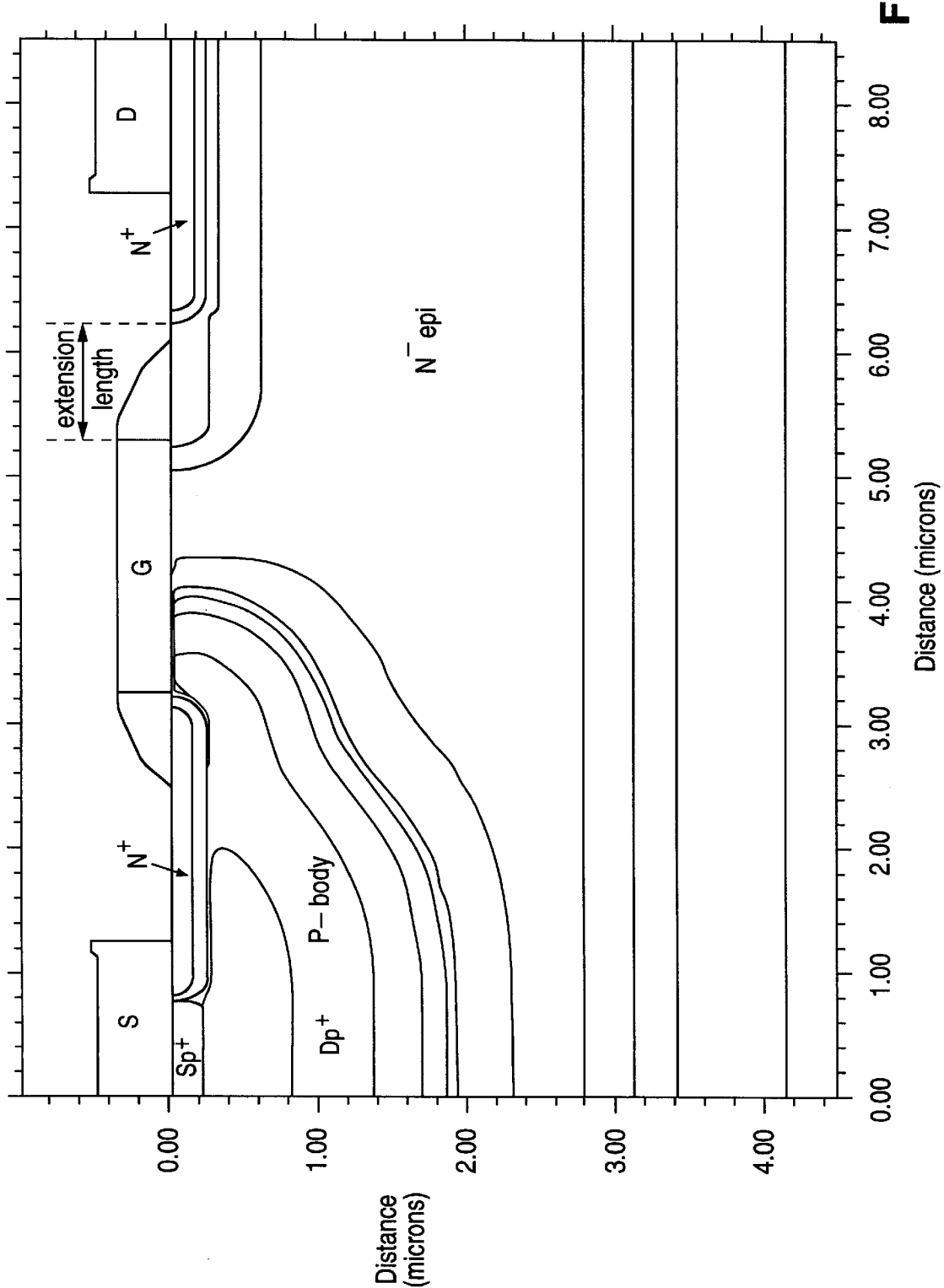
FIG. 8 is a graph showing the two dimensional dopant distribution in the LDMOS device according to the present invention represented by FIG. 6.
Figure 9:
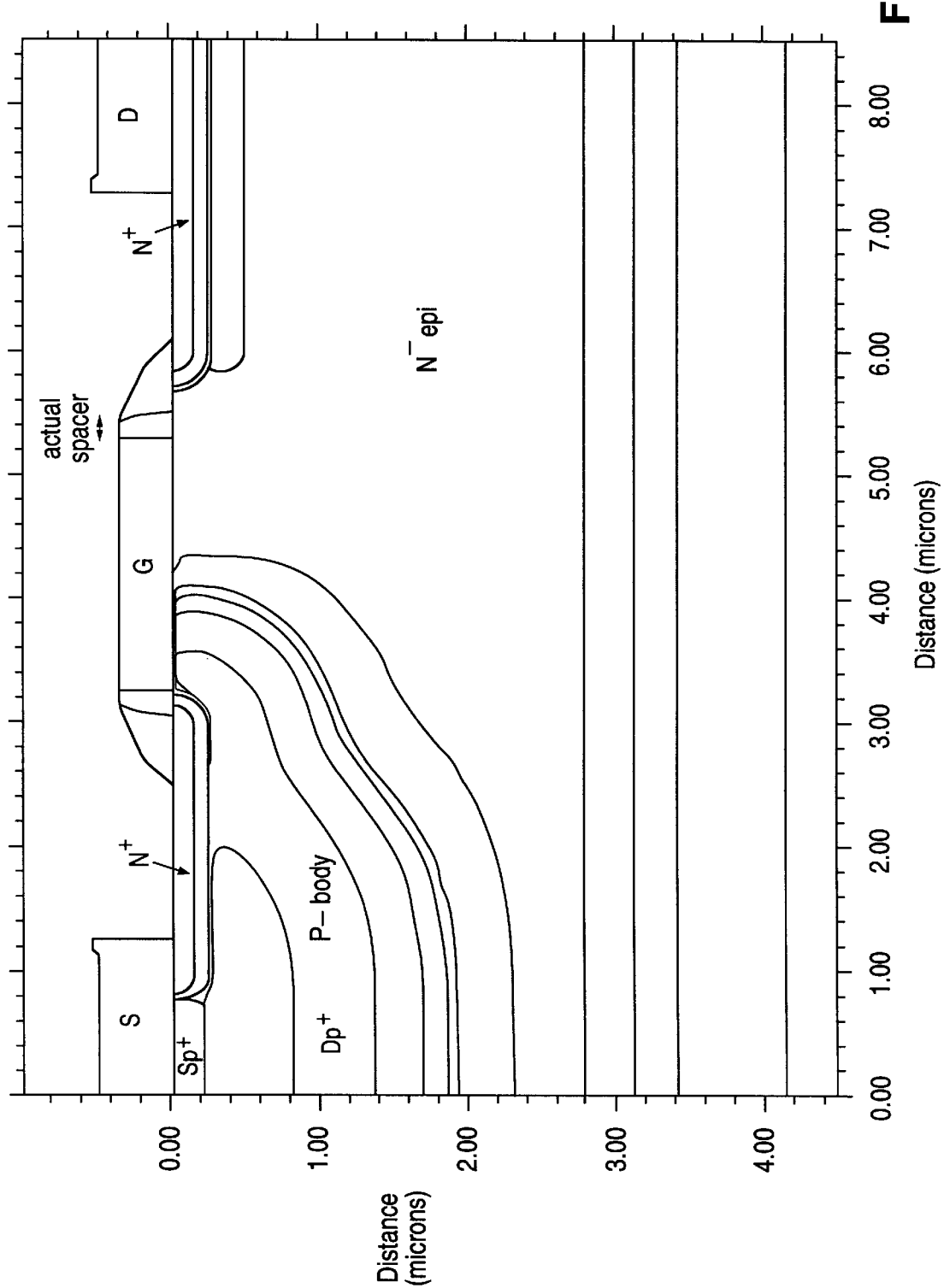
FIG. 9 is a graph showing the two dimensional dopant distribution in another embodiment of an LDMOS device according to the present invention.

As discussed in detail below, to predict on-resistance, breakdown voltage and electric field distribution of devices according to the present invention, computer simulations using 2D SUPREM-IV, a commercially available software from companies such as TMA or Silcaco. Two dimensional dopant profiles for the devices evaluated are shown in FIGS. 7, 8 and 9 (CASES A, B and C, respectively).

Figure 10:
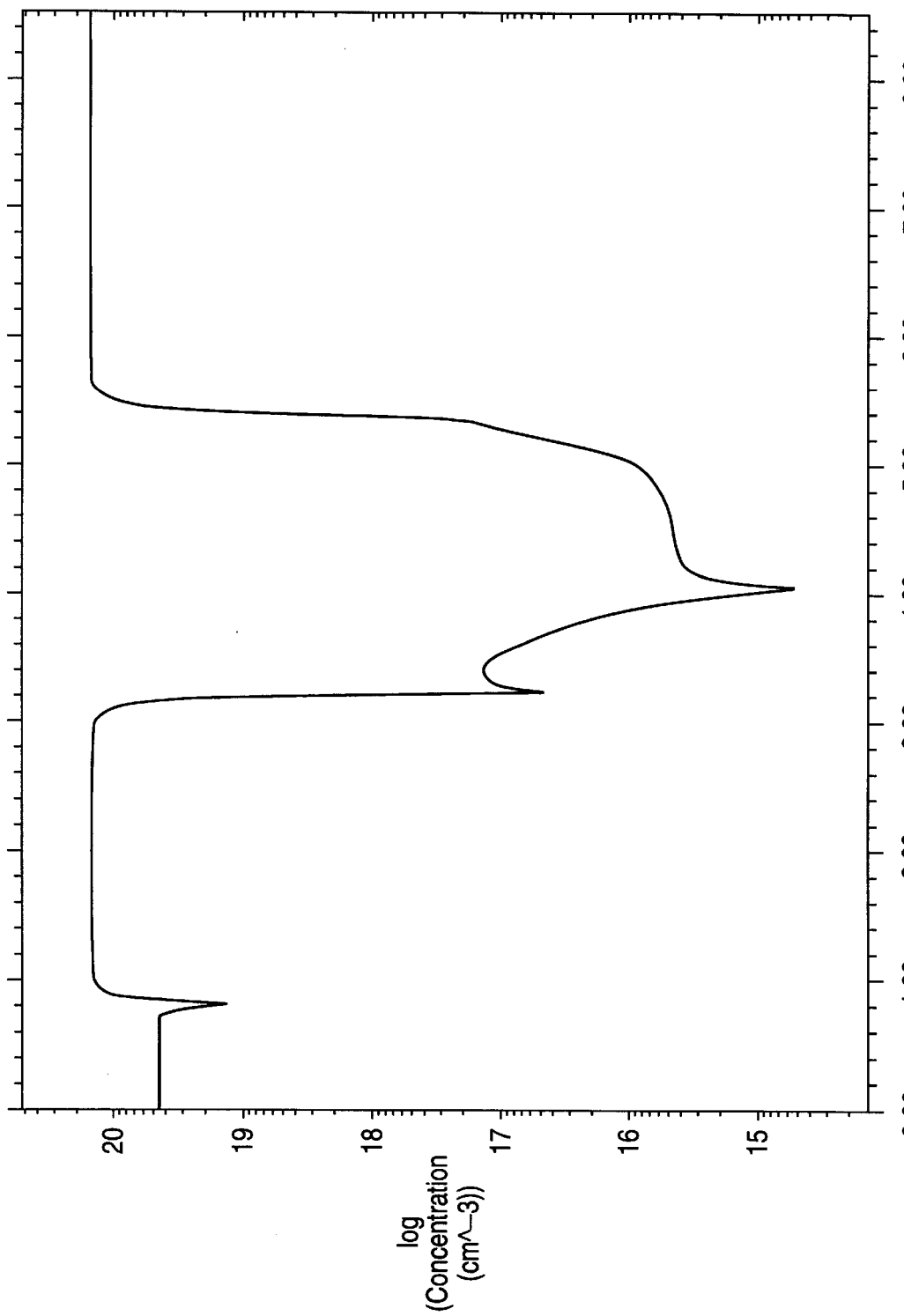
FIGS. 10, 11 and 12 illustrate horizontal doping profiles along the interface between the substrate and the gate for a conventional LDD (lightly doped drain) device, LDMOS device having an extension length of 1 micron and a LDMOS device without LDD implant and with a 1 micron extension region, respectively.
Figure 11:
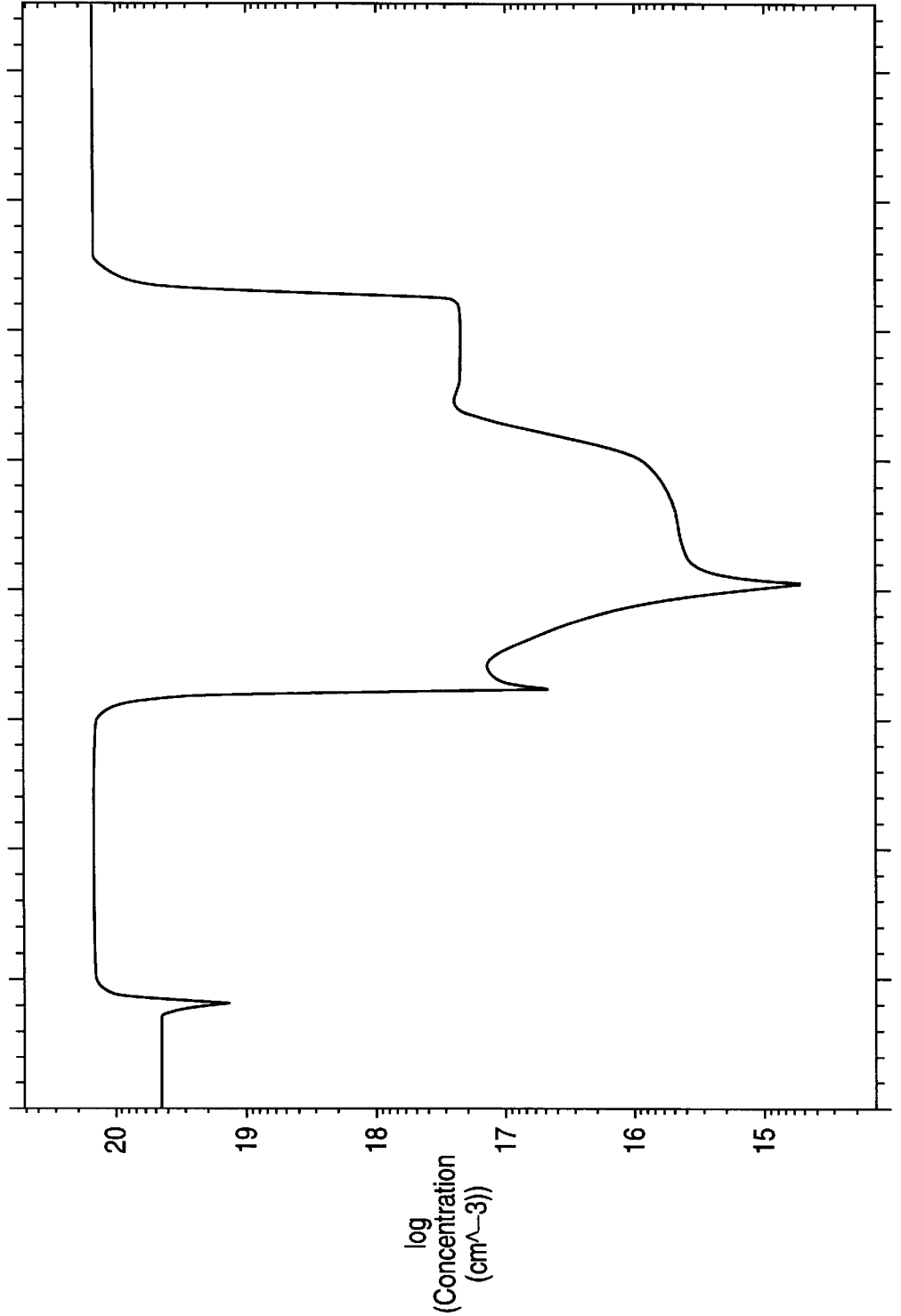
Figure 12:
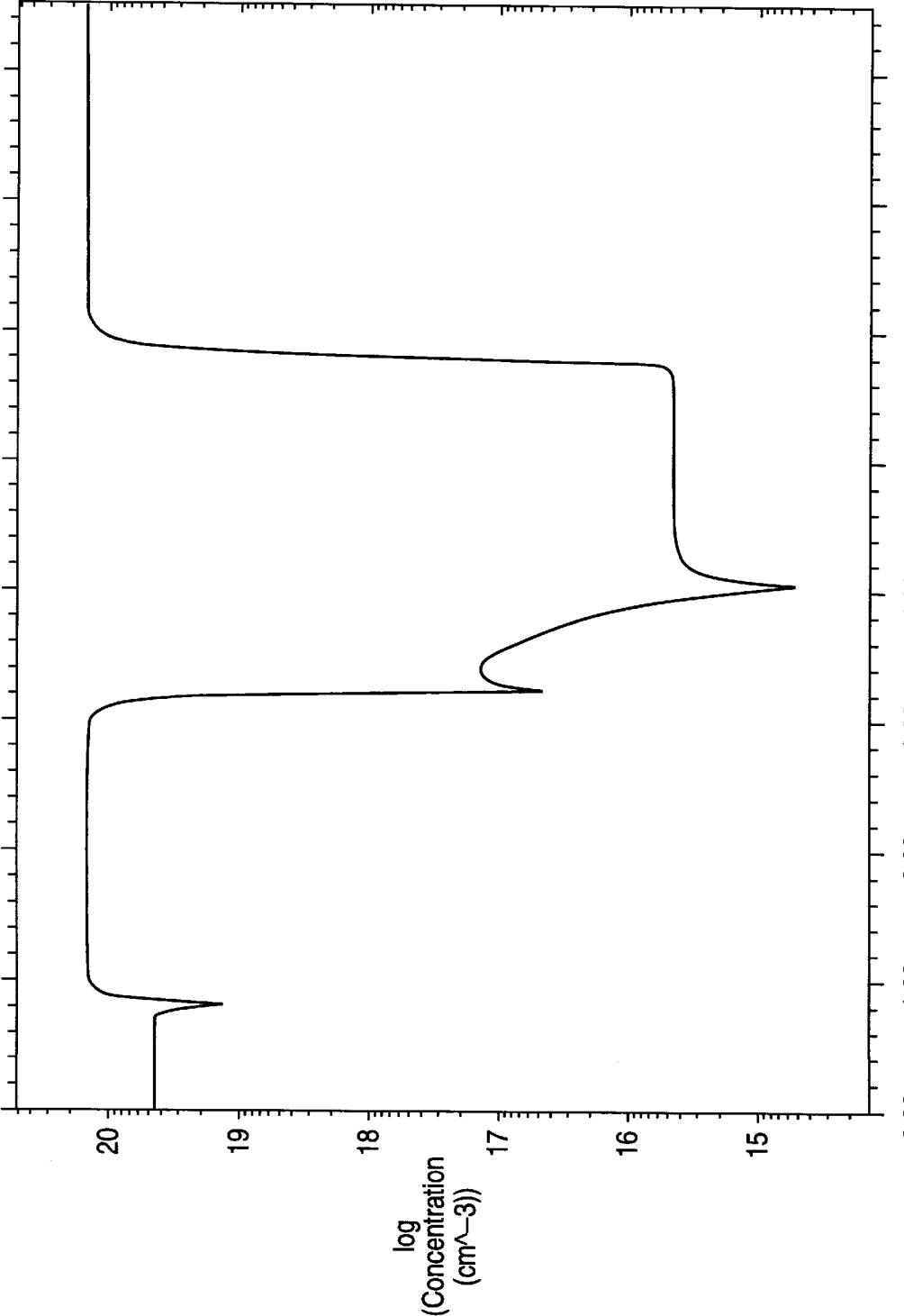

FIGS. 10, 11 and 12 illustrate simulated results of one dimensional doping profiles at the interface of the gate and the epitaxial layer for a conventional LDD device (=CASE A in Table I; where the length of the extension region is less than the spacer width which is typically 0.1–0.2 μm) and two embodiments of the present invention (=CASES B and C in Table I), respectively. In the first embodiment, the LDMOS device has an extension region and in a second embodiment, the extension implant region has been removed from the drain such that doping in the extension defaults to the level in the epitaxial layer.

Figure 13:
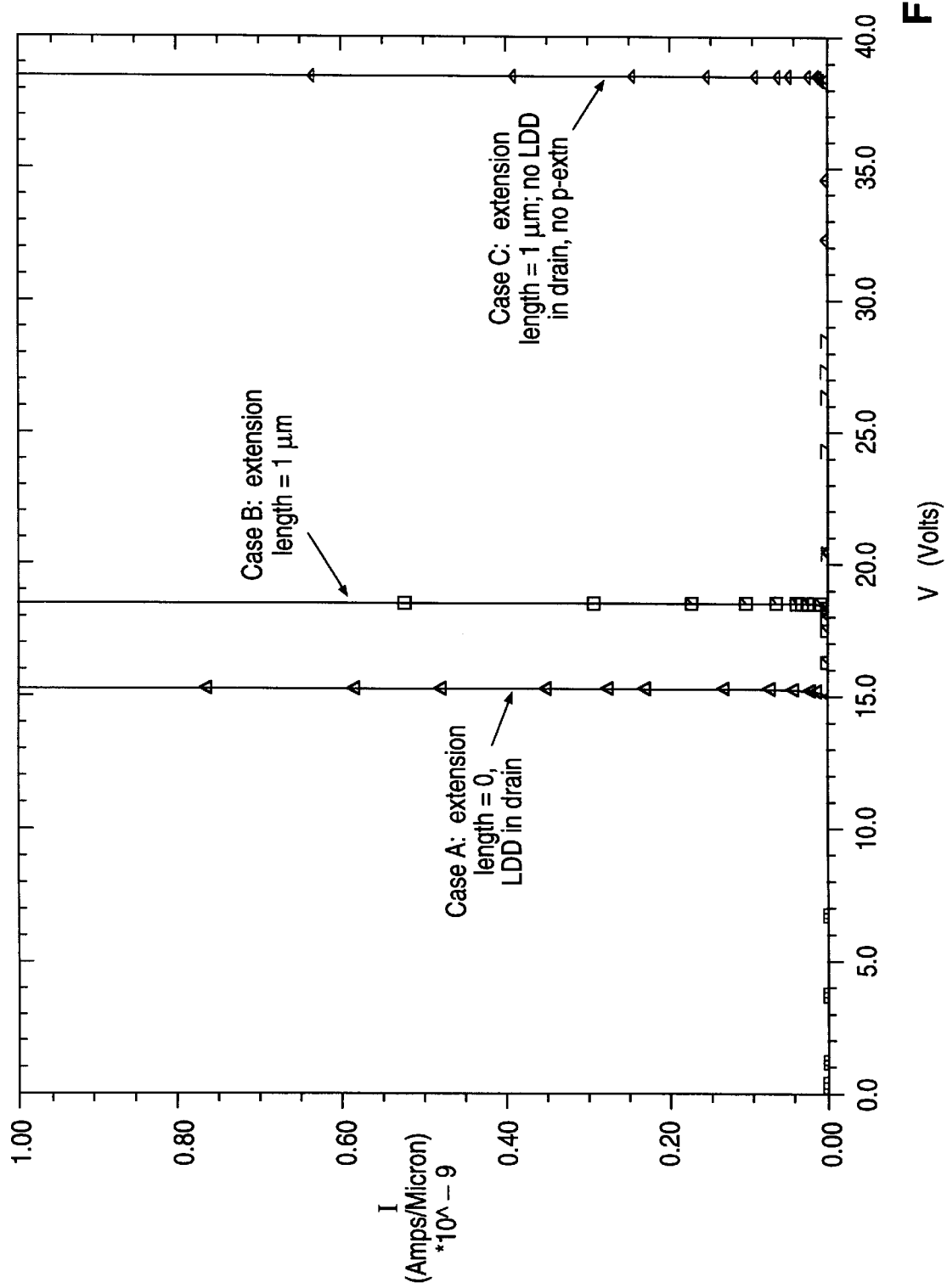
FIG. 13 is a graph illustrating simulated performance in terms of breakdown voltage for the LDMOS devices in FIGS. 10, 11 and 12.

More specifically, the parameters of the simulations used to generate FIGS. 10, 11 and 12 were: 15, 18 and 38 volt drain voltage for devices with 2 micron gate length, 30 nm oxide thickness with 1 micron drain extension regions and similar devices that lack these regions. These results are also summarized in FIG. 13 and Table I.

TABLE I

Summary of Performance Data from Two Dimensional Device Simulations

| Case | A | B | C |
|---|---|---|---|
| BV simulated (volts) | 15.2 | 18.3 | 38.5 |
| BV measured (volts) | 18 | 24.8 | 36.2 |
| $R_{DS}$, measured (mΩ · mm$^2$) @$V_{gs}$ = 5 v | 70 | 90 | 120–140 |
| $R_{DS}$, measured (mΩ · mm$^2$) @$V_{gs}$ = 10 v | 44 | 67 | 100 |

In CASE A, the heavily doped region of the drain is offset from the gate edge 102 by the width of spacer 97 and region 98 spans only the spacer width (minus the lateral diffusion of the heavily doped $N^+$ region). This case represents the lowest breakdown voltage due to the abrupt doping profile at this edge with a correspondingly high peak electric field. It also represents the lowest $R_{DS}$ as the heavily doped region extends all the way to the edge of the gate and therefore negligible contribution to the total series resistance. As in conventional LDD MOS transistors, the presence of the LDD under the oxide spacers with a doping level intermediate to the heavily doped drain 86 and the lightly doped substrate 82 helps to smooth the doping profile in this transition region and therefore lowers the peak electric field and increases to some extent the breakdown voltage. The width of the transition region is limited in this case by the spacer width which usually does not exceed 0.1 μm. The simulated breakdown voltage for one particular process flow is on the order of 15 volts with a corresponding measured breakdown voltage of 18 volts and $R_{DS}$ of about 70 mΩ.mm$^2$.

In CASE B, the preferred configuration, the length of the extension regions is not confined to the spacer width as in CASE A. Whereas the lightly doped extension region extends through the drain region, the heavily doped $N^+$ drain region is confined (through the same mask) to a region in the middle of the drain surrounded by region 98 on all sides. The length of that lightly doped region must be carefully considered along with its doping level. On the one had, relatively long extension regions may cause excessive series resistance without appreciably increasing breakdown voltage. On the other hand, relatively short extension lengths may lead to wide variations in breakdown voltage as a result of misalignment during manufacturing of the mask defining the heavily doped drain and the gate edge. Even with the best lithographic tools, misalignments on the order of 0.1 μm are commonplace. In a test case, where the extension region length was 1.0 μm, doping in the extension region 98 is reduced to a level that breakdown voltage requirements are satisfied. The simulated breakdown voltage for the same process flow described for CASE A but with a 1.0 μm was about 18 volts. The corresponding measured breakdown voltage was about 24 volts (about a 39% increase from CASE A. As expected, the increase in breakdown voltage was at the expense of increased $R_{DS}$ from 70 mΩ.mm² to 90 mΩ.mm², an increase of about 29% compared to CASE A.

In CASE C, the device architecture was tested at the maximum limits of breakdown voltage. That is, while maintaining the extension region length at 1.0 μm, the doping in the extension region was reduced to the minimum (i.e., the background doping of layer 82). Under these conditions, the simulation results and actual measurements of the breakdown voltage are in close agreement (36.2 volts vs. 38.5 volts, respectively). Large fluctuations in $R_{DS}$ were detected, ranging from 120 mΩ.mm² to 140 mΩ.mm². In part, these fluctuations result from the larger fluctuation in resistivity of layer 82 due to limitations of the epitaxial process as opposed to well-controlled doping concentration in extension region 98 as defined through ion implantation. Susceptibility of $R_{DS}$ to misalignment becomes more pronounced when that portion of the device structure becomes the major contributor to $R_{DS}$. It can be seen by comparing $R_{DS}$ for CASES A and C that the extension region contributes approximately 50% to the total $R_{DS}$ in CASE C.

As can be seen from the results, higher breakdown voltage is the result of reduced peak electric field at the drain near the gate due to the presence of the drain extension region in devices according to the present invention.

As expected, there is some variation in the measured values for $R_{DS}$, which is a function of resistivity of the epitaxial layer. Relatively larger deviations between the measured and simulated results at the lower voltages are suspected to be due to a more complicated breakdown mechanism.

Devices according to the present invention can be made with standard CMOS processing. No extra steps are needed and this conventional processing provides the ability to adjust breakdown voltage and series resistance easily, especially by manipulating the dose in the end extension region.

Generally, an exemplary manufacturing technique would include the following steps. First, a gate is formed over an oxide layer on a substrate and then masked. The p body is implanted in the exposed regions. Lightly doped regions aligned with opposite edges of the gate are then implanted to form a drain extension region on both the drain and source sides of the gate. Next, oxide spacers are formed. This structure is then masked and doped in order to form the drain. Additional processing may include implantation of a shallow region adjacent to the source and metallization.

We claim:

1. A method of fabricating an extended drain field effect transistor, the method comprising the sequential steps of:

forming an N+ buried layer on a P-type silicon substrate;

forming an N-epitaxial layer on the N+ buried layer;

forming a silicon oxide layer on the N-epitaxial layer;

forming a layer of conductive material on the silicon oxide layer;

etching the layer of conductive material and the underlying silicon oxide layer to define a conductive gate electrode that is separated from the N-epitaxial layer by silicon oxide;

utilizing the gate electrode in a first self-aligned implantation step that introduces P-type dopant into the N-epitaxial layer adjacent to a first edge of the gate electrode to define a P-body region in the N-epitaxial layer;

utilizing the gate electrode in a second self-aligned implantation step that introduces N-type dopant to simultaneously form a first lightly doped N-type region in the P-body region adjacent to the first edge of the gate electrode and a second lightly doped N-type region in the N-epitaxial region adjacent to a second edge of the gate electrode, the first and second lightly-doped N-type regions being spaced apart to define a channel region therebetween;

simultaneously introducing additional N-type dopant into the first lightly-doped N-type region to convert said region into an N+ source region and into a portion of the second lightly-doped N-type region to convert said portion into an N+ drain region, the N+ drain region being spaced apart from the second edge of the gate electrode to define a lightly-doped N-type drain extension region therebetween.

2. A method as in claim 1, and wherein the N+ source and drain regions have an N-type dopant concentration that is greater than the dopant concentration of the N-epitaxial layer, and the N-type drain extension region has an N-type dopant concentration that is intermediate that of the N+ source and drain regions and the N-epitaxial layer.

3. A method as in claim 2, and wherein the N-epitaxial layer has an N-type dopant concentration of $10^{15}$–$10^{16}$/cm³, and wherein the N+ source and drain regions have a peak N+ type dopant concentration of about $10^{20}$/cm³.

4. A method as in claim 1, and wherein the drain extension region has a length of 0.1–0.2 μm.

* * * * *